United States Patent
Grosch et al.

[19]

[11] Patent Number: 6,122,760
[45] Date of Patent: Sep. 19, 2000

[54] BURN IN TECHNIQUE FOR CHIPS CONTAINING DIFFERENT TYPES OF IC CIRCUITRY

[75] Inventors: David Alan Grosch, Burlington; Marc Douglas Knox, Hinesburg, both of Vt.

[73] Assignee: International Business Machines Corporation, Armonk, N.Y.

[21] Appl. No.: 09/138,997

[22] Filed: Aug. 25, 1998

[51] Int. Cl.[7] .................................................. G01R 31/28
[52] U.S. Cl. ........................................ 714/724; 714/738
[58] Field of Search .................................. 714/718, 720, 714/721, 733, 734, 738, 739; 365/201, 200, 211, 212; 324/763, 765

[56] References Cited

U.S. PATENT DOCUMENTS

| | | | |
|---|---|---|---|
| 4,503,537 | 3/1985 | McAnney ................................. | 714/736 |
| 4,513,418 | 4/1985 | Bardell, Jr. et al. .................... | 714/736 |
| 5,255,229 | 10/1993 | Tanaka et al. ........................... | 365/201 |
| 5,297,087 | 3/1994 | Porter ...................................... | 365/201 |
| 5,375,091 | 12/1994 | Berry, Jr. et al. ....................... | 365/201 |
| 5,381,373 | 1/1995 | Ohsawa ................................... | 365/201 |
| 5,390,129 | 2/1995 | Rhodes .................................... | 702/118 |
| 5,424,988 | 6/1995 | McClure et al. ........................ | 365/201 |
| 5,535,164 | 7/1996 | Adams et al. ........................... | 365/201 |
| 5,557,573 | 9/1996 | McClure .................................. | 365/201 |
| 5,563,833 | 10/1996 | Adams et al. ........................... | 365/201 |
| 5,577,051 | 11/1996 | McClure .................................. | 714/721 |
| 5,590,079 | 12/1996 | Lee et al. ................................. | 365/201 |
| 5,592,422 | 1/1997 | McClure .................................. | 365/201 |
| 5,610,866 | 3/1997 | McClure .................................. | 365/201 |
| 5,615,164 | 3/1997 | Kirihata et al. ....................... | 365/230.6 |
| 5,619,462 | 4/1997 | McClure .................................. | 365/201 |
| 5,629,943 | 5/1997 | McClure .................................. | 714/718 |
| 5,633,877 | 5/1997 | Shephard, III et al. ................ | 714/725 |
| 5,638,331 | 6/1997 | Cha et al. ................................ | 365/201 |
| 5,654,925 | 8/1997 | Koh et al. ................................ | 365/201 |
| 5,657,282 | 8/1997 | Lee .......................................... | 365/201 |
| 5,659,551 | 8/1997 | Huott et al. ............................. | 714/724 |
| 5,668,770 | 9/1997 | Itoh et al. ................................ | 365/227 |

OTHER PUBLICATIONS

IBM Technical Disclosure Bulletin, "Well–Controlled Ratio Logic Circuit", vol. 40, No. 03, Mar. 1997. pp. 117–119.

IBM Technical Disclosure Bulletin, "Computer Memory Testing Using a Specialized Checkerboard Test", vol. 38, No. 08, Aug. 1995, p. 311.

IBM Technical Disclosure Bulletin, "Wafer Level Test and Burn–In", vol. 34, No. 8, Jan. 1992. pp. 401–404.

*Primary Examiner*—Christine Tu
*Attorney, Agent, or Firm*—William N. Hogg

[57] ABSTRACT

An improved technique for testing semi-conductor chips having different types of circuits thereof is provided. The burn-in test includes providing test engines and/or externally applied patterns for each of the different types of circuits, stressing at high temperature and increased voltage, the semi-conductor containing both types of circuits, and running a sequence of patterns on each of said types of circuits simultaneously by the use of the engines for at least one of the types of circuits.

9 Claims, 4 Drawing Sheets

BURN IN TECHNIQUE FOR CHIPS CONTAINING DIFFERENT TYPES OF IC CIRCUITRY

FIELD OF THE INVENTION

This invention relates generally to the testing of circuits on integrated circuit chips and more particularly to burn-in testing of different types of circuits contained on integrated circuit chips.

BACKGROUND INFORMATION

Semi-conductor designs often contain both logic and memory circuits or contain different types of memory array circuits such as static RAMs (SRAMs) and dynamic RAMs (DRAMs). Typically, the circuit designs are "burned in" in a serial fashion; i.e., the logic circuits are burned in and then the memory circuits are burned in; or in the case of different types of memory, the static memory (SRAM) circuits are burned in and then the (DRAM) circuits are burned in. In the burn in of semi-conductor chips, the chips are stressed at elevated temperatures and voltages and various patterns are applied and sequences run for a period of time in a predetermined or preselected sequence. Typically, the patterns and sequences are generated by built-in self test logic referred to BIST and the engines for BIST devices are different for logic and memory and run significantly different patterns and sequences. Also, different engines are used for testing SRAMs and DRAMs contained on the same chip or in the same package. The voltages typically are about 1.1 times to 2.0 times operating voltage and these stress times typically range any where from 3 hours to 100 hours. Thus for each type of circuit there is a period of time required to perform the stress; and the cumulative stress times are significantly increased when the tests are run serially as has been the case in the past.

Thus it is an object of the present invention to provide an improved burn-in procedure for testing semi-conductor designs in which at least one type of circuit is tested by a BIST engines.

SUMMARY OF THE INVENTION

According to the present invention, an improved technique for testing semi-conductor chips having different types of circuits thereof is provided. A burn-in test includes providing test engines or externally supplied patterns for each of the different types of circuits, stressing at high temperature and increased voltage, the semi-conductor containing both types of circuits and running a sequence of patterns on each of said types of circuits simultaneously by the use of the engines for at least one of the types of circuits.

DESCRIPTION OF THE PREFERRED EMBODIMENT(S)

The Present invention provides a technique for simultaneously testing different types of circuits on semiconductors such as both logic circuits and memory array circuits or two types of memory array circuits during the burn-in in function, wherein the burn-in function is performed simultaneously for both types of circuits. The burn-in function is typically accomplished by heating the integrated circuit chips to an elevated temperature of about 90° C. to 160° C. While at these elevated temperatures, the various test patterns and sequences under the control of test engines preferably on the semi-conductor chip are generated. By performing the tests on both the different types of circuits at the same time rather than serially significant time can be saved. Also, during the elevated temperature phase different voltages can be applied for electrically stressing the chips as is well known in the art.

Figure 1:
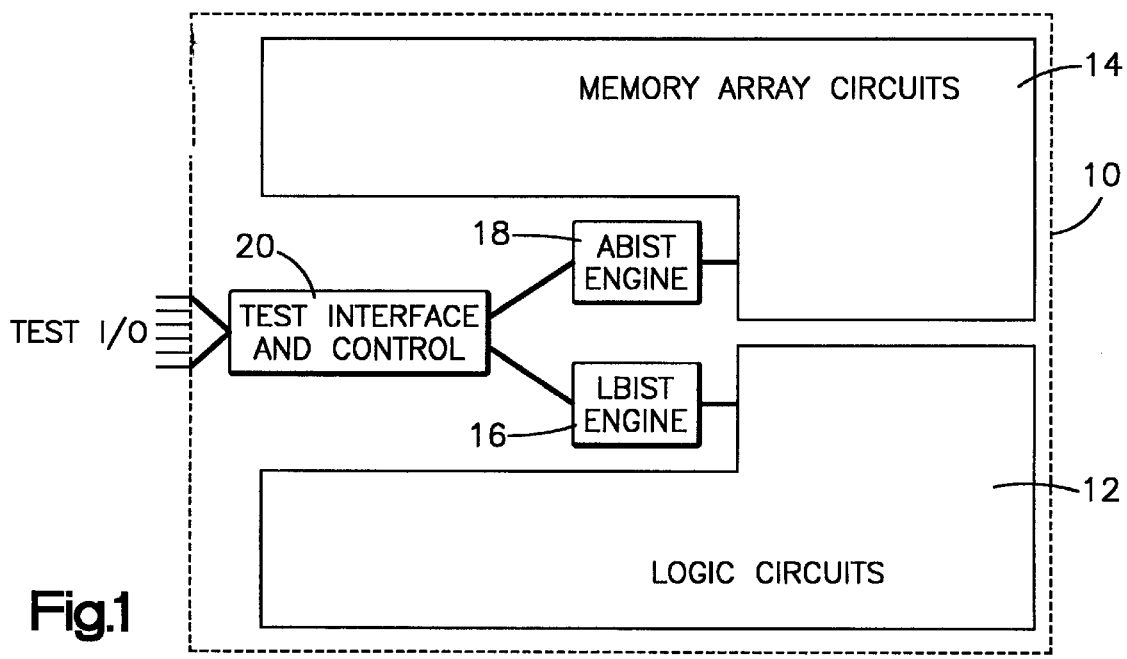
FIG. 1 is a high level diagram showing a single I/C Chip having both memory array circuits and logic circuits thereon each of which types of circuits has its own separate test engine.

Referring now to the drawings, and for the present to FIG. 1, one embodiment of the present invention is shown. In this embodiment a semi-conductor chip 10 is provided which typically is a silicon chip which has thereon logic circuits 12 and memory array circuits 14. (Memory array circuits may sometimes be referred to herein as array circuits.) The logic circuits 12 are tested by a logic built-in self test machine, also known as an LBIST engine 16, which includes a state machine that in a well known manner provides a preselected group of logic patterns to the logic circuits 12 under the control of off chip test vectors which can be programmed to sequence or hold the pattern generated. Off chip test vectors are patterns applied via the I/O of the test interface and control. The off chip test vectors set-up and sequence the BIST state machine. A suitable LBIST engine 16 is shown in commonly assigned U.S. Pat. No. 4,503,537, issued Mar. 5, 1985.

An array built-in self test (ABIST) device 18 is also provided on the chip 10 and is programmed to provide various patterns to the memory array 14 also under the control of off chip test vectors which can be programmed to sequence or hold the pattern generated. Commonly assigned U.S. Pat. No. 5,535,164 dated Jul. 9, 1996 and U.S. Pat. No. 5,563,833 dated Oct. 8, 1996 disclose memory array built-in self test devices ABISTs and the operation thereof that can be used herein. These patents are incorporated herein by reference. The LBIST engine 16 and ABIST engine 18 are both connected to programmable test interface and control circuitry 20 on the chip which is conventional and well known, and which interface and control circuitry 20 receives test I/O signals from off the chip as is conventional. The interface and control circuitry program will be described in detail with respect to FIG. 2.

Figure 2A:
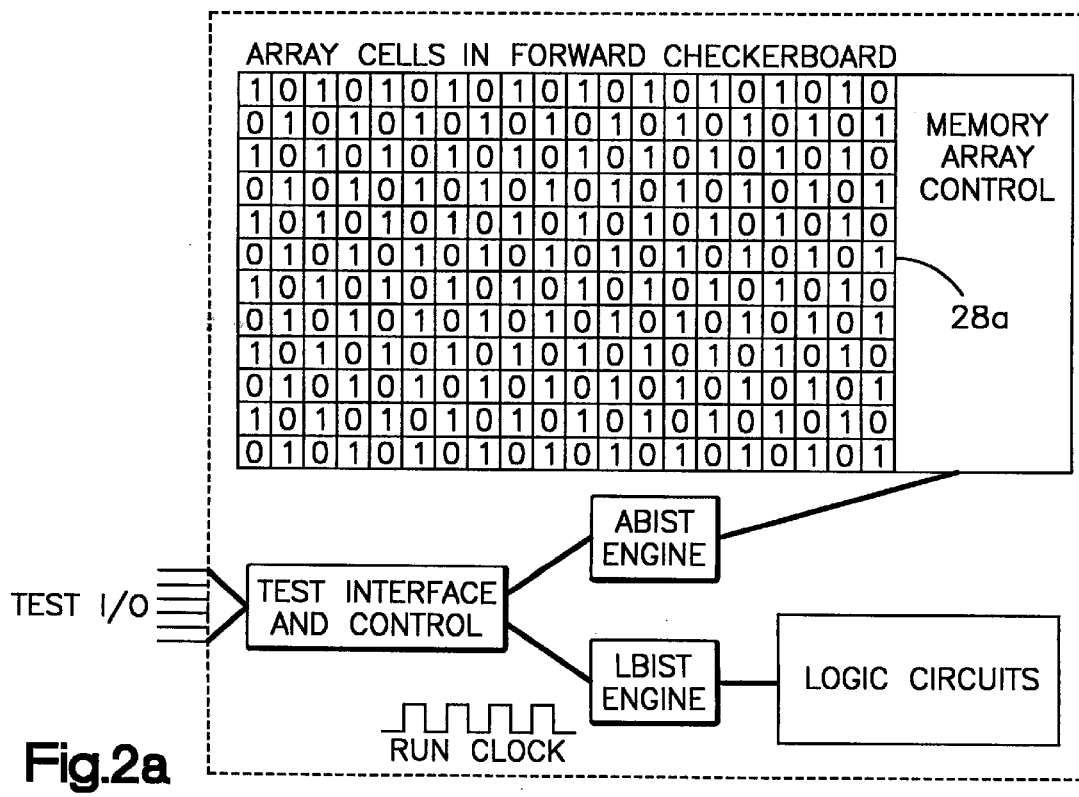
FIG. 2a is a graphic depiction of a portion of the cells in the memory array during the first half of the test time.
Figure 2:
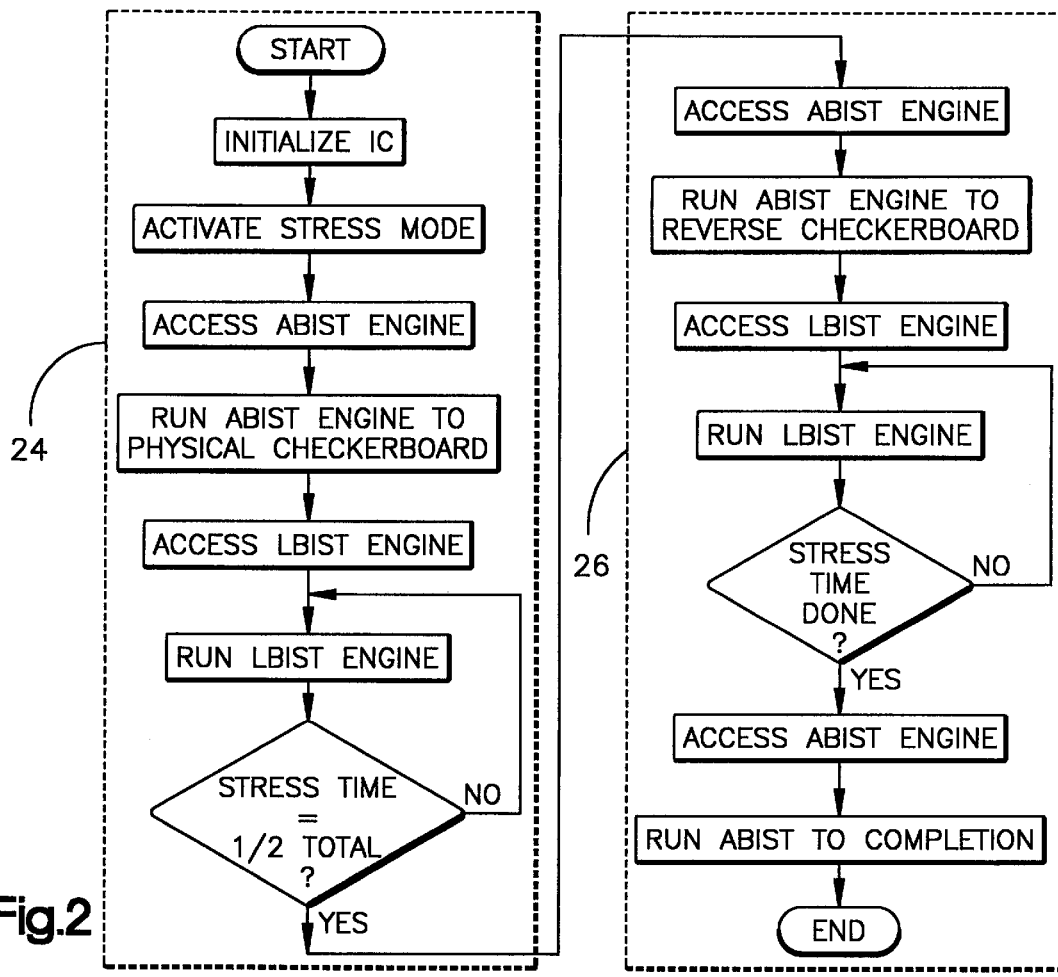
FIG. 2 is a flow chart of one embodiment of a simultaneous test sequence for both the logic circuits and the memory circuits at elevated temperatures.

Referring now to FIG. 2, one test sequence for testing both the logic circuits 12 and memory array circuits 14 is shown. The first half of the test sequence is shown and designated as 24 and the second or final half of the test sequence is shown and designated as 26. The test vectors and the test interface and control circuitry 20 provide the following sequence as shown in FIG. 2. The module is heated to the test temperature, the test voltage is selected and the test is started. The IC chip is initialized. At this point the stress mode is activated, putting the chip in the desired configuration for stress. The test interface and control circuitry then accesses the ABIST engine 18 and runs the ABIST engine to the part of the test that is an optional stress pattern; e.g. a checker board pattern of alternating "1's" and "0's" as shown in FIG. 2a and designated as 28a. This pattern is held in the memory and then the interface and control circuitry 20 accesses the LBIST engine 16. The LBIST engine runs the sequence of patterns programmed therein continuously for the LBIST under test. The total test time for the entire test has been preprogrammed and after each LBIST pattern or sequence is finished, the time is sampled to see if the specified time has elapsed, e.g. ½ the time, if not, the pattern 28a remains in the memory array 14 and the LBIST engine continues to run each pattern or sequence in order.

Figure 2B:
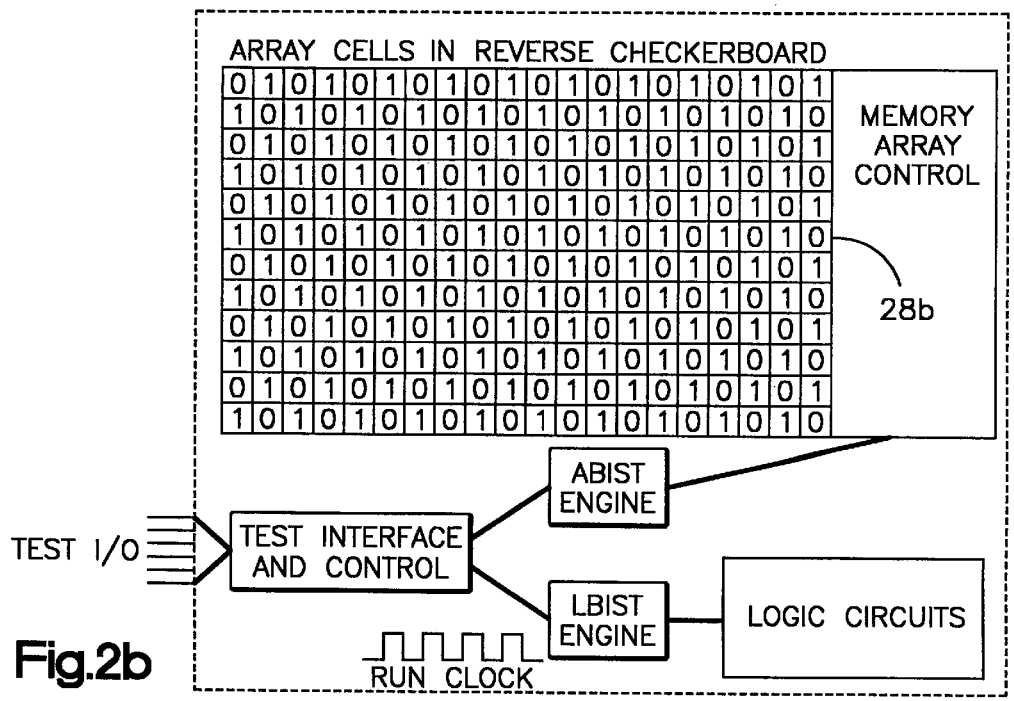
FIG. 2b is a view similar to FIG. 2a showing a portion of the cells in the memory array during the second half of the test time shown in FIG. 2.

Once the specified programmed test time has been reached, the program again accesses the ABIST engine as shown in final sequence 26. The ABIST engine is run to the next optional stress state, e.g. a new checker board as shown in FIG. 2b and designated 28b. The LBIST engine is then accessed and the LBIST engine is run and the total test time is continued to be sampled. As long as the total test time has not been reached, the LBIST engine continues to sequence through the LBIST test patterns until the test time is completed at which time the test interface accesses the ABIST engine, runs the ABIST engine pattern to completion and then ends the test.

As indicated above, the total stress time for burn-in testing typically is from about 3 hours to about 100 hours; however, each test cycle within the total time can be run usually in milliseconds for the ABIST machine and typically in less than 10 seconds for the LBIST machine, thus allowing a significant number of tests to take place during stress testing. The checker board pattern is chosen as an optimum stress state pattern because for some circuit styles, a maximum voltage level between the various cells within the memory is added, thus providing a maximum probability of activating any defect mechanisms that are likely to occur. Other beneficial patterns may also be used, e.g. all "1's", all "0's".

As indicated above, the temperature stress testing can vary between about 90° C. and about 160° C. and the increased voltage for testing burn-in is typically about 1.1 times to 2.0 times operating voltage, although other temperatures and other voltages can be used.

Figure 3:
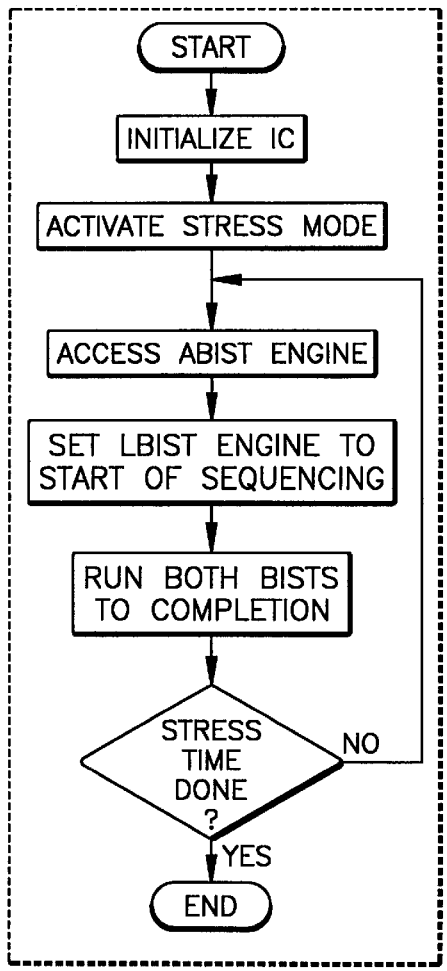
FIG. 3 is a flow chart showing another test sequence for the single chip module shown in FIG. 1.

While the alternating checker board pattern is extremely useful and an excellent way to provide a good chance of catching many types of errors which are likely to occur during burn-in, there are also other optimal stress states. For example, as shown in FIG. 3, the interface and control circuitry 20 and test vectors can have a program which allows the various test sequences and patterns in the ABIST state machine 18 to continue sequencing though this programmed sequence while the sequencing of the test patterns in the logic circuits under the control of the LBIST engine 16 continues. This is shown wherein the test starts by initializing the array circuit chip and activates the stress mode and then accesses the ABIST machine engine to start sequencing. Thereafter, the LBIST machine starts sequencing; and thus both of the LBIST and ABIST tests are run concomitantly. The test time is sampled to determine if it is done, and if not, the test is restarted by accessing the ABIST and LBIST machines and run through the cycles again until the sample shows the test time completed. In some instances this test will be particularly useful for inducing certain types of errors by continuously running all the tests rather than statically holding the memory in any single static stress state during the sequencing of the LBIST engine 16.

When the two circuit types are run simultaneously, there are design considerations which must be made to prevent interaction that would not occur during testing in a serial fashion. The two circuit types (and the respective BIST engines) are degated from each other at the interface between the array and logic (not shown). Degating logic is activated under the control of the test and interface control. Pass gates or an exclusive-OR function in-line with the interactive signals can be used to accomplish this task.

Figure 4:
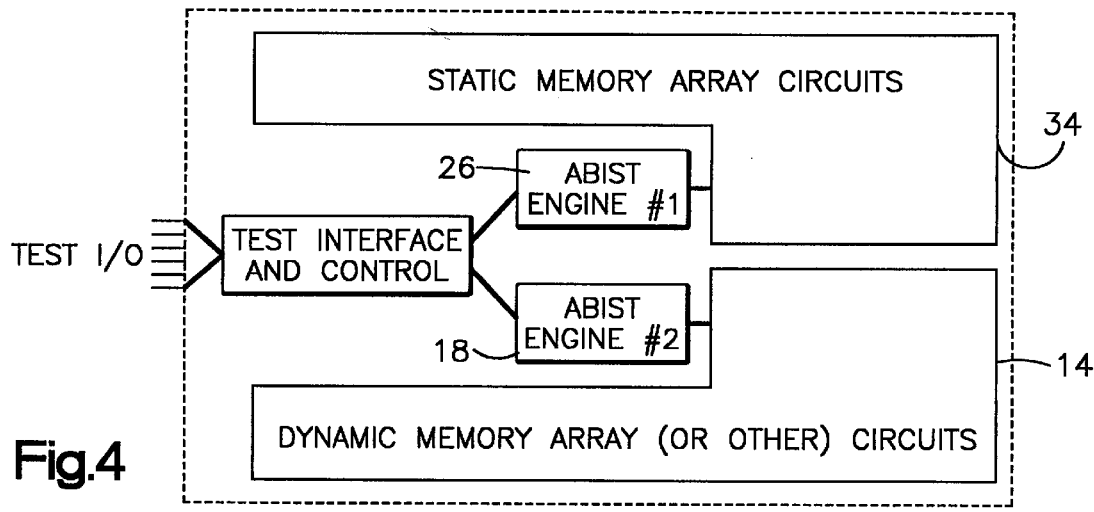
FIG. 4 is a high level diagram of a single chip module with both static and dynamic memory array circuits.

FIG. 4 shows the set up for testing a single chip which has two different types of circuits, i.e. it has a dynamic memory array 14 and a static memory array 34 with the dynamic memory array being under the control of the ABIST state engine 18 and the static memory array being under the control of static RAM ABIST engine 26. Again both the static SRAM and dynamic DRAM memory array circuits are on the same chip.

Figure 5:
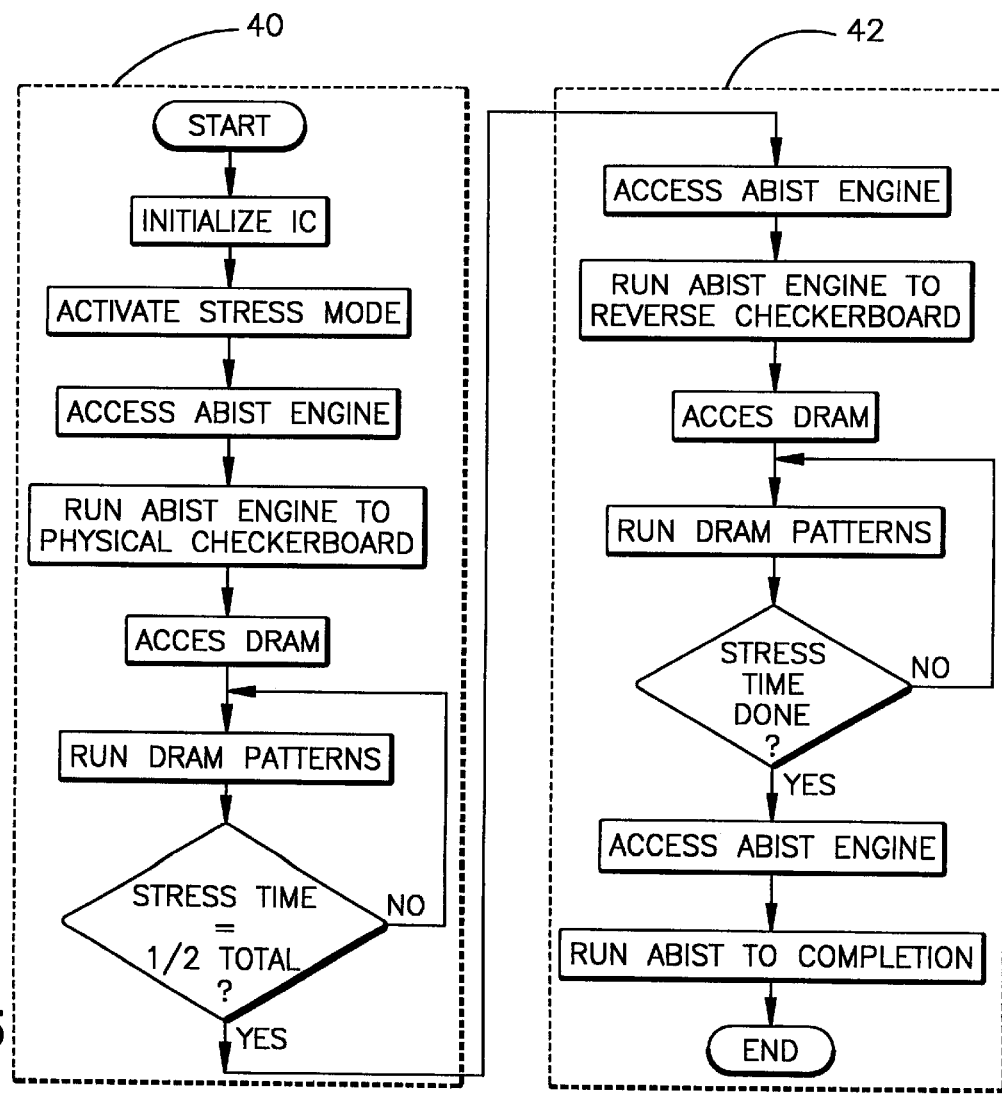
FIG. 5 is a flow chart showing one test sequence for the modules of FIG. 4.

The testing programmed for the arrangement of FIG. 4 is shown in FIG. 5, wherein the static RAM is set to a particular physical checker board during the first half of the stress testing 40. This is reversed during the second half of the stress testing 42 whereas the engine for the DRAM repeatedly runs the test patterns during the entire time against the static RAM being first in one condition and then the other. Of course, it is to be understood that the same type of testing could take place as is shown in FIG. 3 wherein both the static RAM and DRAM tests are being conducted simultaneously and the test sequence is continuing as shown in FIG. 3.

Figure 6:
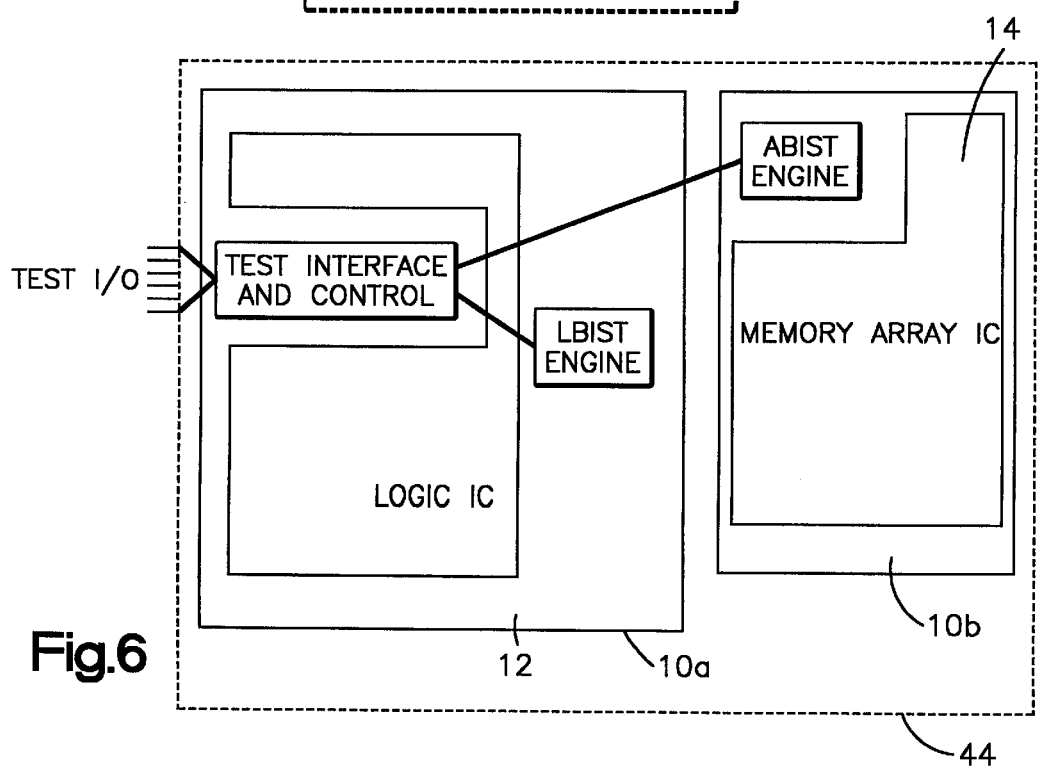
FIG. 6 is a high level diagram of a multi chip module with logic circuitry on one chip and memory circuitry on another mounted on a substrate which circuitry is all tested together.

FIG. 6 shows a multi chip module wherein the logic circuit 12 is on one semi-conductor chip 10a and the memory array circuitry 14 is on another semi-conductor chip lob which chips are mounted on some type of a multi chip module substrate 44. In this case, the test interface and control is located on the logic chip 10a, although, it could be located on either chip depending upon the availability of space.

The embodiment of FIG. 6 is conceptually the same as the embodiment of FIG. 1. The embodiment of FIG. 6 can also be viewed as a complement to the embodiment of FIG. 1. The embodiment represents individual and separate silicon chips. The embodiment of FIG. 1 represents the integration of these macros onto a single silicon die. The physical interconnections between the macros is accomplished in the embodiment of FIG. 6 by wiring between the chip. The physical interconnections of the embodiment of FIG. 1 are within internal silicon wiring levels.

While the present invention has been illustrated by the description of embodiments thereof, and while the embodiments have been described in considerable detail, it is not the intention of application to restrict or in any way limit the scope of the appended claims to such detail. Additional advantages and modifications will readily appear to those skilled in the art. For example, but not by way of limitation, certain procedures may be called or implemented in different sequences and certain procedures may be subroutined into one or more subroutines. Therefore, the invention, in its broader aspects, is not limited to the specific details, the representative apparatus, and illustrative examples shown and described. Accordingly, departures may be made from such details without departing from the spirit or scope of the applicant's general inventive concept.

It is claimed:

1. A method of burn-in testing of at least one computer chip having two different types of circuits, and wherein each type of circuit has its own programmable self testing logic on each said at least one chip for generating a sequence of test patterns unique to each of the types of circuits, said method comprising;

applying a burn-in test temperature and voltage to the said at least one chip, and concomitantly running the self test logic and generating the patterns in each circuit.

2. The method of claim 1 wherein one of said types of circuits is a memory array circuit.

3. The method of claim 2 wherein the self testing logic for the memory array circuit includes logic to generate a predetermined static pattern in memory.

4. The invention as defined in claim 3 wherein the memory array is held at said predetermined static pattern for a selected portion of the burn-in test time and at a second predetermined static pattern for another portion of the burn-in test time.

5. The invention as defined in claim 4 wherein each of said predetermined static patterns is a checker board pattern.

6. The invention as defined in claim 2 wherein the other of said types of circuits is logic circuitry, and said self testing logic for the logic circuitry includes logic to repeat sequencing of the pattern though the programmed self testing logic of the logic circuitry when the burn-in test is run.

7. The invention as defined in claim 2 wherein each of said types of circuits is a memory circuit, one a DRAM and one a SRAM.

8. The invention as defined in claim 1 wherein each of said types of circuits is on a single chip.

9. The invention as defined in claim 1 wherein each of said types of circuits is on a different chip mounted on a single substrate.

* * * * *